United States Patent [19]

Habeger, Jr. et al.

[11] Patent Number: 5,781,110

[45] Date of Patent: Jul. 14, 1998

[54] ELECTRONIC ARTICLE SURVEILLANCE TAG PRODUCT AND METHOD OF MANUFACTURING SAME

[75] Inventors: Charles C. Habeger, Jr., Milford; Kenneth A. Pollart, Mason, both of Ohio

[73] Assignee: James River Paper Company, Inc., Milford, Ohio

[21] Appl. No.: 640,463

[22] Filed: May 1, 1996

[51] Int. Cl.⁶ .................................................. G08B 13/14
[52] U.S. Cl. ................ 340/572; 340/825.54; 343/895; 29/832; 29/854
[58] Field of Search ................ 340/572, 825.54; 310/311; 343/895; 333/205; 29/832, 854

[56] References Cited

U.S. PATENT DOCUMENTS

| | | | |
|---|---|---|---|
| 3,157,847 | 11/1964 | Williams | 333/95 |
| 4,007,541 | 2/1977 | Monforte et al. | 29/600 |
| 4,532,704 | 8/1985 | Green | 29/600 |
| 4,567,473 | 1/1986 | Lichtblau | 340/572 |
| 4,575,700 | 3/1986 | Dalman | 333/238 |
| 4,638,271 | 1/1987 | Jecko et al. | 333/205 |
| 4,658,264 | 4/1987 | Baker | 343/895 |
| 4,706,050 | 11/1987 | Andrews | 333/205 |
| 4,785,271 | 11/1988 | Higgins, Jr. | 333/204 |
| 4,818,312 | 4/1989 | Benge | 156/52 |
| 4,835,524 | 5/1989 | Lamond et al. | 340/572 |
| 4,846,922 | 7/1989 | Benge et al. | 156/324 |
| 4,865,921 | 9/1989 | Hollenberg et al. | 428/461 |
| 4,883,936 | 11/1989 | Maynard et al. | 219/10.55 F |
| 4,910,499 | 3/1990 | Benge et al. | 340/572 |
| 5,027,106 | 6/1991 | Lizzi et al. | 340/572 |
| 5,041,319 | 8/1991 | Becker et al. | 428/71 |
| 5,059,951 | 10/1991 | Kaltner | 340/572 |
| 5,103,209 | 4/1992 | Lizzi et al. | 340/572 |
| 5,108,822 | 4/1992 | Imaichi et al. | 428/209 |
| 5,160,905 | 11/1992 | Hoang | 333/204 |
| 5,172,461 | 12/1992 | Pichl | 29/25.42 |
| 5,293,140 | 3/1994 | Higgins | 333/204 |
| 5,357,229 | 10/1994 | Benton | 333/205 |
| 5,373,271 | 12/1994 | Hirai et al. | 333/205 |
| 5,373,301 | 12/1994 | Bowers et al. | 343/742 |
| 5,381,137 | 1/1995 | Ghaem et al. | 340/572 |
| 5,396,201 | 3/1995 | Ishizaki et al. | 333/204 |
| 5,408,206 | 4/1995 | Turunen et al. | 333/204 |
| 5,416,492 | 5/1995 | Takahashi et al. | 343/771 |
| 5,424,517 | 6/1995 | Habeger, Jr. et al. | 219/728 |
| 5,463,404 | 10/1995 | Wall | 343/700 MS |
| 5,494,550 | 2/1996 | Benge | 156/268 |
| 5,592,150 | 1/1997 | D'Hont | 340/572 |
| 5,604,485 | 2/1997 | Lauro et al. | 340/572 |

FOREIGN PATENT DOCUMENTS

| | | |
|---|---|---|
| 0136265 | 9/1984 | European Pat. Off. |
| 3602848 | 8/1987 | Germany. |

Primary Examiner—Jeffery A. Hofsass
Assistant Examiner—Benjamin C. Lee
Attorney, Agent, or Firm—Wood, Herron & Evans LLP

[57] ABSTRACT

An RF EAS tag includes a substrate with a conductive element positioned on a face surface thereof and having electrically inductive properties. A capacitive element is positioned on the face surface and has electrically capacitive properties wherein the inductive and capacitive elements are operably coupled together to form a resonant circuit which resonates when an electrical signal of a predetermined resonant frequency is applied to the tag. The capacitive element comprises a dielectric ink substance having a high dielectric constant for producing the desired resonant circuit on a single face surface of the substrate. An alternative tag comprises a substrate with a conductive layer positioned thereon and a gap formed in the conductive layer exposing a portion of the substrate. This forms a slotline waveguide shorted at both ends. A high dielectric constant ink substance is then deposited in the slot. This greatly reduces the wavelength in the waveguide allowing an RF frequency 1/2 wavelength resonant line to be made of a practical length.

45 Claims, 4 Drawing Sheets

ELECTRONIC ARTICLE SURVEILLANCE TAG PRODUCT AND METHOD OF MANUFACTURING SAME

FIELD OF THE INVENTION

The present invention relates generally to an electronic article surveillance product and more specifically to an RF electronic article surveillance (EAS) tag structure which incorporates an electrical circuit for being detectable by a detecting system.

BACKGROUND OF THE INVENTION

Electronic article surveillance (EAS) systems for detecting the theft or unauthorized removal of retail articles are generally known. One popular type of surveillance system utilizes tags or labels containing electronic circuits. When an article with the tag thereon passes through the detection portion of the surveillance system at the entrance or exit of a facility, the system initiates an alarm, usually an audible sound. When the article is legitimately obtained, such as by being purchased, the tags are removed or deactivated so that a person can pass through the detecting system without activating the alarm.

More specifically, some such RF EAS systems as described use tags containing resonant electrical circuits. The resonant tag circuits are tuned or constructed for a particular resonant frequency or for a resonant frequency within a predetermined bandwidth of detecting frequencies. A detection portion of the system includes transmitting and receiving units which are operable to detect a resonant condition at a particular frequency. When a person passes through the system with an article containing a tag, the resonant condition is detected and an alarm sounds.

Various different resonant tag products are commercially available and described in issued patents, for example, U.S. Pat. Nos. 5,172,461; 5,108,822; 4,835,524; 4,658,264; and 4,567,473 all describe and disclose electrical surveillance tag structures. However, such products utilize, and indeed require, substrates which use patterned sides of conductive material on both face surfaces of the substrate for proper operation. Special conductive structures and manufacturing techniques must be utilized on both substrate faces for producing such resonant tag products.

Currently available EAS tag structures have numerous drawbacks. For example, since special patterning and etching techniques must be utilized on both sides of the available tags to produce the proper circuit, per unit processing time and costs are increased. Furthermore, the complexity of the manufacturing machinery required for production is also increased. Oftentimes, complex photo-etching processes are used to form the circuit structures. As may be appreciated, two sided photo-etching is generally time consuming and requires precise alignment of the patterns on both sides. Additional material is also necessary to pattern both sides, thus increasing the per unit material costs. Still further, and particularly important, is the need for an additional electrical connection which must be made between the two face surfaces for operation of the circuit. Such an interconnection may require an additional processing step, further increasing costs and reducing production yield.

Presently, the available resonant tag products are available for approximately 3–5 cents or more. Therefore, for an appreciable number of articles, the costs of the surveillance tags alone for a retailer may be in the tens of thousands of dollars per year, reducing the profit recognized per article for the retail establishments using the tags. Generally, such tags are deactivated in such a way that they are not reusable.

Therefore, it is an objective of the present invention to overcome the drawbacks and deficiencies of the prior art and to simplify the manufacturing of an EAS tag while still providing a product which is small, reliable, and low cost. To that end, it is another objective of the present invention to reduce the number of complex processing steps necessary for making an EAS tag.

It is another objective to reduce the per unit material requirements for such a tag.

It is a further overall object to reduce the per unit costs of an EAS tag and particularly an EAS tag utilizing a resonant circuit.

SUMMARY OF THE INVENTION

The above objectives and other objectives are addressed by the invention which includes a radio frequency (RF) EAS tag comprising a substrate having circuit components formed on one side thereof for forming a resonant circuit. The tag comprises at least one component which is formed with a high dielectric constant ink substance to provide resonance within a circuit of useful size. The ink substance is deposited in accordance with the principles of the present invention and the high dielectric constant ink substance allows construction of a small RF resonant circuit which has a sufficient quality factor (Q) for sharp resonance. The invention provides single-sided construction on the substrate and eliminates the need for through-substrate or face-to-face electrical interconnection while providing a reliable resonant circuit. Thus, the complexity and costs associated with producing resonant tags will be reduced.

More specifically, one embodiment of the present invention comprises an inductive and capacitive or LC circuit comprising a substrate made of a material such as plastic or paper. Suitable plastics are polyethylene, polypropylene and polyester which are generally preferable over paper to produce less loss and a higher Quality factor or Q-factor as discussed further hereinbelow. An inductive coil or inductor is formed on one side of the substrate, such as by laminating a thin layer of metal thereon and etching away certain areas of the metal to form a generally spiral and planar metal pattern on the substrate. Other deposition or application techniques might also be utilized to form the spiral pattern. The spiral metal pattern of the inductive coil includes a plurality of adjacent intercoil turns which have inductive properties to provide the desired inductance for the resonant circuit.

An ink-like substance or ink having a high dielectric constant, is deposited or applied, such as by printing techniques, on at least a portion of the spiral metal pattern and spans over and between the intercoil turns. The ink in combination with the intercoil turns effectively forms a capacitive element or capacitor in the resonant circuit. The capacitor is electrically parallel with the inductive coil, and the combination of the capacitor and inductor coil are fabricated to provide resonance at the desired frequency for detection. As used herein, the terms "inductor" or "capacitor" do not always indicate a single inductor or a single capacitor, but may also denote collective elements having overall electrically inductive or capacitive properties.

The inductance value of the circuit is adjustable by varying the number of intercoil turns, the radii of the turns and the width of the planar space spiral pattern forming the coil. The capacitance value is adjustable by varying the dielectric constant of the ink, the spacing between the intercoil turns, the thickness of the applied ink and the length of the ink portion overlying the turns of the spiral pattern.

The circuit is preferably tuned to resonate at the desired detecting frequency of an RF EAS detection system, for example 8.2 MHz. The invention provides a resonant circuit with a suitable Q-factor which is fabricated on a single side or face of the substrate, thus reducing the complexity of the tag by eliminating the necessity of processing the other face of the tag. Furthermore, a face-to-face interconnection is eliminated further reducing the overall costs and complexity of an article surveillance tag.

Another embodiment of the invention utilizes an electrically-shorted slotted line waveguide for forming a resonant cavity or resonant circuit and comprises a substrate as discussed above having a thin layer of metal deposited thereon for forming a ground plane conductor. A long, narrow and generally parallel-sided gap or slot is formed in the conductor such as by etching or cutting away a portion of the ground plane metal. Ink with a high dielectric constant is applied or printed into the gap and the ink dielectric spans between the sides of the gap. The ground plane, slot and high dielectric constant ink produce a shorted waveguide resonator, and the high dielectric properties of the ink in the slot provide a resonant structure which is reasonable in size for use within an EAS tag at acceptable resonant frequencies. Varying the dielectric properties of the ink, the dimensions of the slots, and the thickness of the ink dielectric, as well as the substrate material and ground plane material will produce varying resonant frequency and Q-factors for tuning the circuit.

Therefore, the invention provides a single-face RF EAS tag which is less complex to manufacture than conventional two-face tags and thus is generally less expensive to manufacture per tag unit. The inventive tag utilizes less conductive material than a two-face tag and provides resonance at a desired frequency within structures having a size suitable for use as article tags.

The above and other objects and advantages of the present invention shall be made apparent from the accompanying drawings and the description thereof.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

Figure 1:
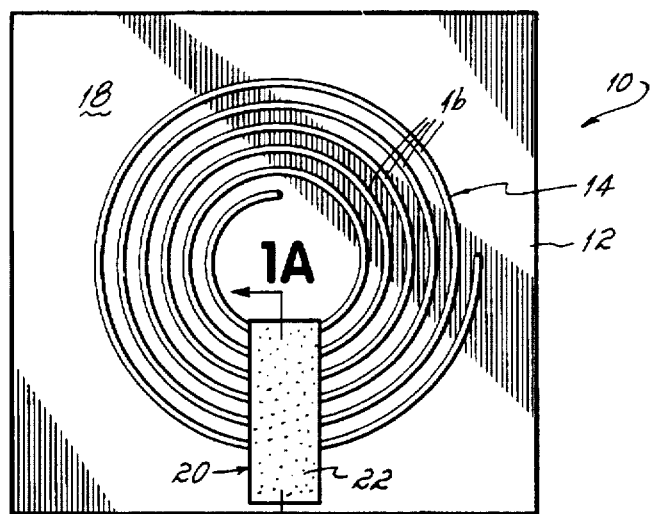
FIG. 1 is a top view of one embodiment of the tag structure in accordance with the principles of the present invention.

Referring to FIG. 1, an EAS tag 10 manufactured in accordance with the principles of the present invention comprises a substrate 12 which is made of a paper or plastic material. Plastic materials such as polyethylene, polypropylene and polyester are suitable and preferably a plastic substrate is utilized for tag 10 because plastic will generally have less loss and insure a higher Quality factor or Q-factor for the circuit of tag 10 as discussed further hereinbelow.

A first element 14 is positioned on one face surface or face of the substrate and will generally comprise a conductive element formed of a suitable conductive material or metal, such as aluminum foil. The conductive element 14 has inductive properties, and in the embodiment illustrated in FIG. 1, the inductive element 14 is a coil formed in the shape of a spiral pattern which has a plurality of adjacent intercoil turns 16. The inductive element 14 has the inductive properties of a traditional inductor coil.

Preferably, inductive element 14 is planar and the spiral pattern is appropriately positioned on the face surface 18 of substrate 12 such that the planar pattern is generally parallel to the face surface 18.

Inductive element 14 may be formed such as by selectively depositing metal in the spiral pattern illustrated. Alternatively, a continuous layer of material might be laminated to the face surface 18 and then selectively etched or removed to provide the spiral pattern of inductive element 14. Photo-etching is a suitable technique for such patterning. When tag 10 is exposed to an RF signal, inductive element 14 has inductive properties sufficient to create a resonant condition as described when combined with a capacitor.

A second element 20 is also positioned on substrate 12 and on the same face surface 18 as inductive element 14. Element 20 provides capacitive properties to tag 10 such that the capacitive element 20 and inductive element 14 are operably coupled together to form a resonant circuit on tag 10 that resonates and responds to a predetermined resonant frequency applied thereto in accordance with the principles of the present invention .

Figure 1A:
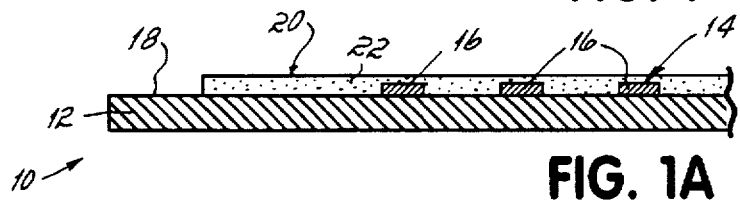
FIG. 1A is a side sectional view along lines 1A—1A of the tag structure of FIG. 1.

Element 20 comprises a an ink-like substance or ink 22 having a high dielectric constant. The ink is applied generally on top of the spiral pattern of inductive element 14 such as by being printed onto the substrate by a gravure or silkscreen process. Referring now to FIG. 1A, the dielectric ink 22 is generally applied over all or a portion of the intercoil turns 16 of inductive element 14 and between adjacent intercoil turns. Ink 22 preferably has a very high dielectric constant which is in the range of approximately 5,000 to 1,000,000. In cooperation with the conductive intercoil turns 16, the ink substance 22 forms capacitive element 20 and creates a capacitance which is electrically in parallel with the inductance of the inductive element 14. That is, element 20 includes ink 22 and portions of the coil turns 16. The intercoil turns 16 with the dielectric therebetween essentially forms a series of generally parallel plate capacitors. As will be appreciated when the word "capacitor" or "inductor" is used herein, it will not always mean a single capacitor or a single inductor, but may also designate collective elements having overall electrically inductive or capacitive properties. The combination of elements 14,20 creates a parallel LC circuit which resonates at a predetermined resonant frequency.

Capacitive element 20 is shown to extend across all the intercoil turns 16 of inductive element 14. Alternatively, element 20 might also extend only across some of the intercoil turns 16 and at least across two of the intercoil turns 16. The circuit of tag 10 formed in accordance with the principles of the present invention yields a tag having a resonant LC circuit located on only one face surface 18 of the tag. Accordingly, processing steps for producing other elements on the other face surface of tag 10 are eliminated thereby reducing the complexity of the manufacturing process and the manufacturing costs associated therewith. Ultimately, the present invention yields a simpler, more inexpensive EAS tag 10 which replaces the conventional two-sided, complex and expensive tags.

Figure 8:
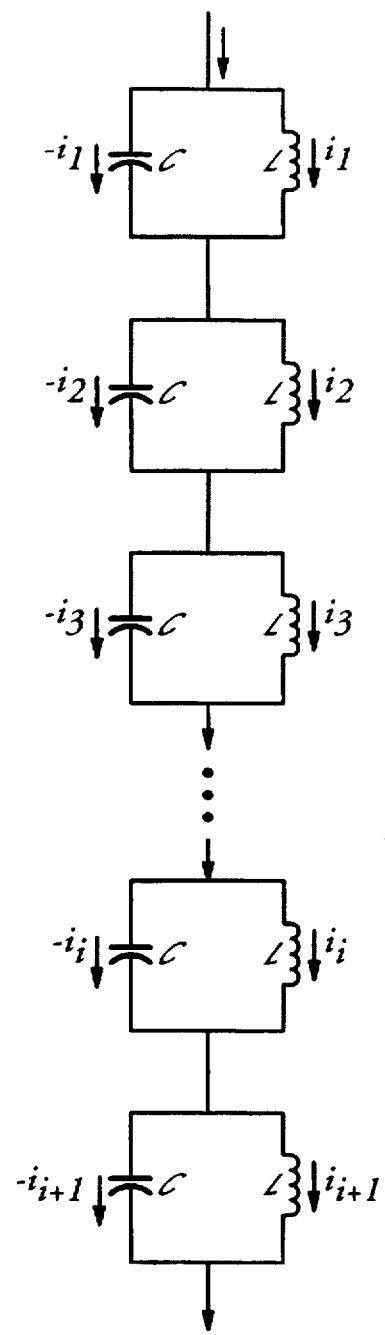
FIG. 8 is a circuit schematic estimating the electrical configuration of one embodiment of the present invention for the purpose of analysis.

The capacitance of capacitive element 20 formed by ink substance 22 is distributed between the intercoil turns 16 of inductive element 14. An analysis of the inventive circuit is useful in describing the present invention. The inductive element 14 of tag 10 may be divided, for analysis, into discrete intercoil turns 16 with an inductance $L_i$, i=1,n. Each intercoil turn 16 is coupled to its nearest adjacent intercoil turns with a capacitance C. There would also generally be a mutual inductance $M_{ij}$ which links each intercoil turn with every other intercoil turn. The inventive circuit of tag 10, without including the mutual inductive terms, may be envisioned as a series combination of parallel combinations of an inductor and a capacitor (see FIG. 8).

A mathematical analysis of the tag considers the current $i_i$ in the "ith" loop. The total current between loops is zero because the total current in the end turns is zero. The current in each parallel capacitor leg must therefore be equal and opposite to the current in the respective parallel inductor leg. The voltage across the ith inductor of any particular loop is given according to Equation 1.

$$e_i = L_i di_i/dt + \sum_{\substack{j=1,n \\ i \neq j}}^{n} M_{ij} di_j/dt \quad i = 1, n \qquad \text{EQ. 1}$$

The current for each capacitor is given by Equation 2.

$$i_i = -C \, de_i/dt \qquad \text{EQ. 2}$$

Combining Equations 5 and 6 yields the n circuit equations denoted by Equation 3.

$$e_i = -CL_i d^2e_i/dt^2 - \sum_{\substack{j=1,n \\ i \neq j}}^{n} CM_{ij} d^2e_j/dt^2 \quad i = 1, n \qquad \text{EQ. 3}$$

To obtain a resonant frequency for such a circuit, solutions in the form of $e_i = A_i e^{i\omega t}$ are obtained by setting the determinant of the n equations noted by Equation 4 to zero.

$$(\omega^2 L_i C - 1)e_i + \sum_{\substack{j=1,n \\ i \neq j}}^{n} C\omega^2 M_{ij} e_j = 0 \quad i = 1, n \qquad \text{EQ. 4}$$

Solving for a two turn or two loop circuit and assuming that the coupling coefficient $m_{12}$ is approximately one yields Equation 5. The term of mutual inductance $M_{ij}$ is related to $L_i$ and $L_j$ through the coupling coefficient $M_{ij}^2 = m_{ij}^2 L_i L_j$.

$$\omega^2 = 1/C(L_1 + L_2) \qquad \text{EQ. 5}$$

If the coupling coefficient is less than one, two resonant frequencies exist as discussed further hereinbelow.

Solving for a three turn circuit, with $m_{12}$, $m_{13}$, and $m_{23}$, each=1, for the determinant of Equation 4 and assuming that the coupling coefficient m is one, there is a single resonant frequency indicated by Equation 6.

$$\omega^2 = 1/(L_1 + L_2 + L_3)C \qquad \text{EQ. 6}$$

Again, if the coupling coefficients are not equal to one for each coil turn 16, resonance will generally occur at three different frequencies. Extrapolating the two-turn and three-turn results to the n-turn case, yields Equation 7.

$$\omega^2 = 1/\Sigma L_i C \qquad \text{EQ. 7}$$

If the interturn capacitance for each turn is not equal to C, Equation 7 would become Equation 8.

$$\omega^2 = 1/\Sigma L_i C_i \qquad \text{EQ. 8}$$

Imperfect Mutual Coupling

If the coupling coefficients $m_{ij}$ are less than one, there is a shift in the main resonance and the introduction of additional resonances. One cause of imperfect coupling is the variation of the area of each turn. In order to get an estimate of the mutual inductance terms and to determine the consequences of less than perfect coupling a pair of inductor coils one inside of the other is considered. With the inner coil having $N_1$ turns and a radius $R_1$ and the outer coil having $N_2$ turns and having a radius of $R_2$ with each coil having a length s which is long compared to the radius, the inductance turns may generally be estimated by Equations 9, 10 and 11.

$$L_1 = \mu_0 N_1^2 \pi R_1^2/s \qquad \text{EQ. 9}$$

$$L_2 = \mu_0 N_2^2 \pi R_2^2/s \qquad \text{EQ. 10}$$

$$M_{12} = \mu_0 N_1 N_2 \pi R_1^2/s \qquad \text{EQ. 11}$$

Where $\mu_0$ is the permeability of free space with a value of $4\pi(10^{-7})$ Henrys/meter. Since $m_{ij}^2$ is equal to $M_{12}^2/L_1 L_2$, the coupling coefficient is stated according to Equation 12.

$$m = R_1/R_2 \qquad \text{EQ. 12}$$

Since, the single-loop planar inductance terms are difficult to calculate, Equation 13 is utilized for the planar loop coupling coefficient for the purpose of assessing order of magnitude affects dependent upon varying loop sizes.

$$m_{ij}^2 = (M_{ij}^2/L_i L_j)^{1/2} = (R_i/R_j)^2 \, i<j \qquad \text{EQ. 13}$$

To illustrate the effect of less than perfect flux coupling on a resonant frequency, consider the general resonant frequency condition for a two loop tag. Setting the determinant of Equation 4 to zero gives a quadratic equation in the form of Equation 14 wherein a equals $(1-m_{12}^2)/4$ and x is defined as $2LC\omega^2$.

$$\alpha x^2 - x + 1 = 0 \qquad \text{EQ. 14}$$

Solving Equation 14 for a perfect coupling, that is, m equal to 1, yields $\omega^2 = \frac{1}{2}LC$. However, when m does not equal zero and $\alpha$ is also non-zero, a solution of Equation 14 yields Equation 15 which when the plus alternative in Equation 15 is inserted and $\alpha$ is small, yields Equation 16.

$$x_l = |1 \pm (1-4\alpha)^{1/2}|/2\alpha \qquad \text{EQ. 15}$$

$$x_h^1 = 1/\alpha \qquad \text{EQ. 16}$$

For any reasonable amount of coupling, the solution of Equation 16 is well out of the range of the (x=1) resonance. The lower frequency resonance, from Equation 17, is slightly above the result obtained when assuming perfect coupling.

$$x_l = 1 + \alpha = 1 + (1 - m_{12}^2)/4 \qquad \text{EQ. 17}$$

Therefore, imperfect coupling has two consequences. First, an extra high-frequency resonance appears along with a shift of the established resonance to a slightly higher value. The trend continues as the number of intercoil turns increases wherein imperfect coupling will create additional very high frequency resonances and will cause an upward shift of the calculated resonant frequency for the perfect coupling assumption, i.e., $m_{ij} = 1$.

With additional analysis on a three turn system of the invention, and assuming that inductances of each turn are equal yields Equation 18 wherein x equal $3LC\omega^2$ and $1 - m_{12} \approx 1 - m_{13} \approx 1 - m_{23}^2 \approx 6\beta$. Assuming that $\beta$ is small, the inventors conclude that two additional high frequency resonances are introduced, one near $2/\beta$ and one near $\frac{1}{2}\beta$. The solution near the perfect coupling result is given by Equation 19.

$$\beta^2 x^3 - 2\beta x^2 + x - 1 = 0 \qquad \text{EQ. 18}$$

$$x_1 = 1 + 2\beta - \beta^2 = 1 + (1 - m^2)/3 - (1 - m^2)^2/36 \qquad \text{EQ. 19}$$

That is, there are now two high frequency solutions and the low frequency solution is shifted a little bit higher in magnitude. Extrapolating the Equations 17 and 19 to a case having multiple loops n and ignoring terms of second order and higher in $1-m^2$ yields Equation 20 where m is taken as the average coupling coefficient between loops and x is $\omega^2 \Sigma L_i C_i$.

$$x_1(n) = 1 + (n-1)(1-m^2)/2n \approx 1 + (1-m^2)/2 \qquad \text{EQ. 20}$$

The tag of one embodiment of the present invention wherein $m \approx \frac{3}{4}$ should have a low frequency resonance generally in the order of that given in Equation 21.

$$\omega^2 = 1.2/\Sigma L_i C_i \qquad \text{EQ. 21}$$

Wherein $L_i$ represents the single turn inductance of the "ith" turn and the $C_i$ as the ith interturn capacitance.

Properly rearranged Equation 21 gives an estimate of the dielectric constant of the ink necessary to make a practical RF EAS tag in accordance with the principles of the invention. Once the standard resonant frequency of RF EAS tags (8.2 MHz) is adopted and L is estimated, the interloop capacitance, C, drops out of Equation 21. Next, the dielectric constant is found from C, the interloop spacing, the ink run length, and the ink depth or thickness.

Considering a typical EAS coil, let the loops be nested and square (FIG. 1B), and let n=10. The side lengths of the loops range from 17 mm inside to 36 mm outside. The foil line width is about 0.5 mm and the gap between loops is also about 0.5 mm, the equation for the inductance of a single, circular, wire loop is $L = \mu_0 R \ln(8 R/a)$, where R is the loop radius and a is the wire radius. If one half the line width is substituted for a, and R is replaced with one half the average side length, an estimate of the average inductance of a single turn in a medium-sized RF tag is calculable.

The result is $L \approx 0.14$ μH. Putting this value of inductance, $\omega = 2\pi \times 8.2$ MHz, and $a = 0.5$ mm into Equation 21, reveals that an interloop capacitance of about 320 pf is needed.

The interloop capacitance is $C \approx k \Sigma_0 st/d$, where k is the dielectric constant of the ink, d is the spacing between loops, t is the ink thickness, and s is the length of the ink strip between loops. Assuming that 25 μm is a maximum practical thickness of ink and that the full coil is printed (average $s \approx 10$ cm), the capacitance equation dictates a minimum dielectric constant of about 7,000. For conventionally utilized dielectric substances, this is a large number. Therefore, in accordance with the principles of the present invention, an ink having a high dielectric constant is utilized. With higher dielectric constant inks, similar resonances are achieved at less ink thickness or with less ink coverage.

Resonant Frequency Measurements

For the experimentation, several different inks were utilized in accordance with the principles of the present invention. These inks and their formulations are described as follows:

Ink 1 (small flake) (S)

The Ink 1 coating formulation was made by mixing 39 g of aluminum flake slurry (average flake particle size of 13.9 μm×7.4 μm), which was 12.9% solids in ethyl acetate, with 20 drops of dispersant (Ken-React KR 38S from Kenrich Petrochemicals, Inc. of Bayonne, N.J.) and 4.5 g of n-propyl acetate. To this was added 2.14 g of Acryloid B82 (an acrylic polymer from Rohm and Haas Co.) in 2.56 g of n-propyl acetate. This 15% solids formulation, having a 70/30 aluminum flake to binder ratio, was applied to sections of a planar, ten turn, coil with an eye dropper and allowed to air dry.

Ink 2 (small flake) (S2)

A portion of the above formulation for Ink 1 (s) was diluted to 12% solids by adding more n-propyl acetate. Again sections of a planar coil were coated via the same procedure.

Ink 3 (large flake) (L)

This coating formulation, also having a 70/30 aluminum flake to binder ratio, was made by the same procedure as Ink 1 except that 48.5 of aluminum flake slurry (average flake particle size of 22 μm×11.3 μm) which was 10.3% solids in n-propyl acetate was used and enough n-propyl acetate was added to obtain a final solids formulation of 8%. The coating was again applied to a planar coil via an eye dropper and allowed to air dry.

Further disclosure regarding the use of metal flake inks is given in U.S. Pat. No. 5,424,517 which is commonly owned with the present application and is incorporated by reference herein in its entirety.

Figure 1B:
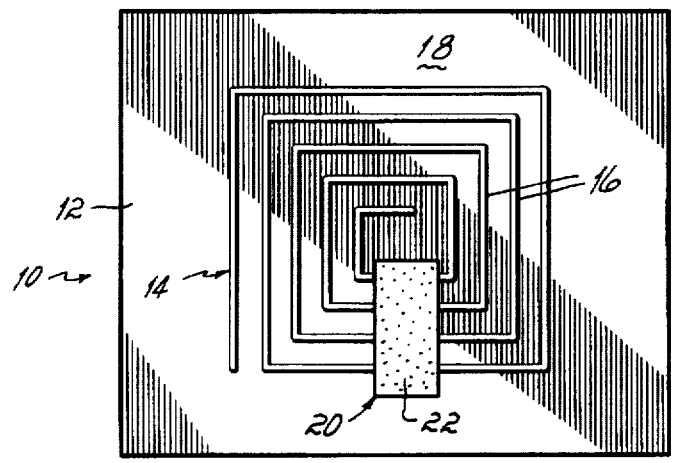
FIG. 1B is another embodiment of the tag structure in accordance with the principles of the present invention.

Six different tags were manufactured, two utilizing each of the three ink substances discussed above. Planar ten turn coils, as described above, were coated with sections of ink of length s as shown in FIG. 1B. The resonant frequencies of the tags were measured using an HP8753A Network Analyzer.

The output of the Network Analyzer was connected to a short electric dipole probe, whereas a small loop magnetic dipole probe antenna was applied to the analyzer input, the loop was placed near the center of the tag on the backside and the electric dipole was aligned with the outer loop on the tag frontside. The frequency of the Network Analyzer output was swept over the tag frequency range, and the resonant frequency was detected as a peak in the output.

TABLE 1

| Tag  | tag f MHz | s (mm) | $k_d$  |
|------|-----------|--------|--------|
| S-1  | 17.4      | 18     | 9,000  |
| S-2  | 14.2      | 33     | 7,400  |
| S2-1 | 18.4      | 17     | 8,500  |
| S2-2 | 14.3      | 34     | 7,100  |
| L-1  | 7.3       | 19     | 48,500 |
| L-2  | 5.3       | 36     | 48,500 |

The measured resonant frequencies of the tags are displayed in Table 1. Also listed are the lengths of the ink strips and the dielectric constant of the inks as calculated from the resonant frequencies assuming a thickness of 25 mm (Equation 21). This demonstrates that the prepared inks have the necessary large dielectric constant to make practical RF EAS tags according to the principles of the present invention.

Figure 2:
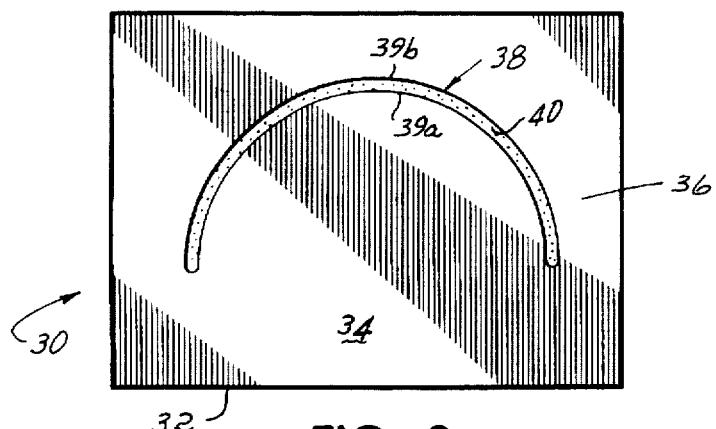
FIG. 2 is another embodiment of the tag structure in accordance with the principles of the present invention.

Referring now to FIG. 2, an alternative embodiment of an article surveillance tag 30 manufactured in accordance with the principles of the present invention is shown. The embodiment illustrated in FIG. 2 comprises a substrate 32 formed of a suitable material such as paper or plastic. For example, a plastic substrate of polyethylene, polypropylene or polyester is suitable for tag 30. Preferably, a plastic substrate is utilized because it has lower loss characteristics than a paper substrate, and thus a higher Quality factor or Q-factor to be discussed further hereinbelow.

Figure 5:
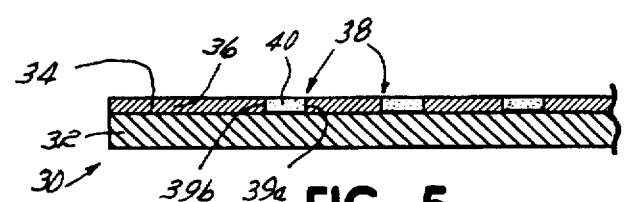
FIG. 5 is a side sectional view along lines 5—5 of the tag structure of FIG. 2A.

Referring to FIG. 5, substrate 32 includes a face surface 34, and portion of the face surface 34 includes a ground plane 36 which will preferably be a conductive metal, such as aluminum, for example. The ground plane 36 may be applied directly on to substrate 32 or may consist of a preformed layer, such as a foil layer, which is positioned over a portion of face surface 34. The ground plane 36 acts as an electrical ground plane for tag 30 and will cover an appropriate portion of face surface 34, and possibly the entire face surface, for proper operation as a ground plane. Ground plane 36 may have various thicknesses as dictated by the construction of the resonant circuit of tag 30 discussed further hereinbelow.

Figure 4:
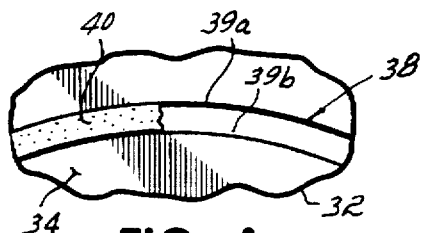
FIG. 4 is an enlarged view of a portion of the tag structure of FIG. 2.
Figure 2A:
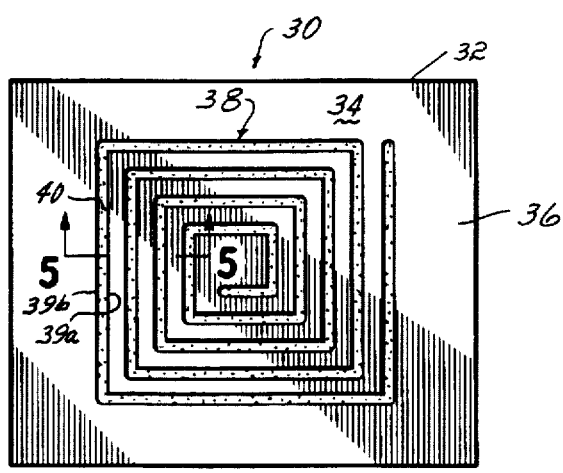
FIG. 2A is another embodiment of the tag structure in accordance with the principles of the present invention.
Figure 2B:
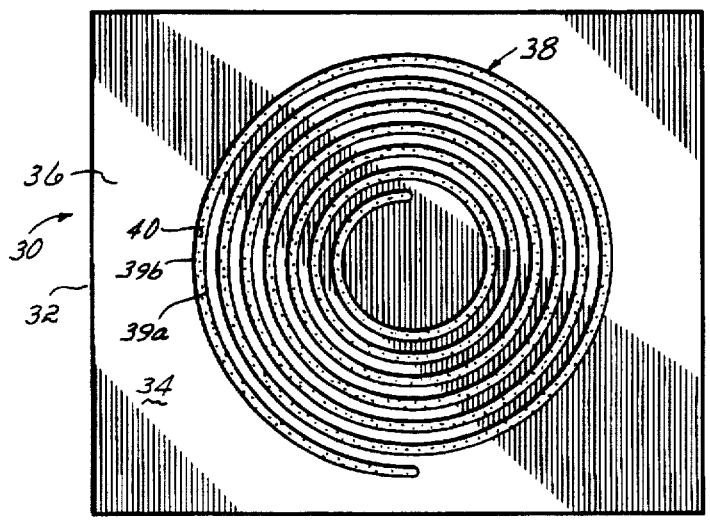
FIG. 2B is another embodiment of the tag structure in accordance with the principles of the present invention.

Formed within ground plane 36 is a gap or slotline 38 which generally exposes a portion of the substrate face 34 below the conductive layer of ground plane 36. Gap 38 may take a variety of different shapes, as illustrated in FIGS. 2, 2A and 2B, and preferably will be formed to have generally parallel opposing walls 39a and 39b to effectively form a waveguide often referred to as a slotline waveguide (see FIGS. 4 and 5). In accordance with the principles of the present invention, gap 38 is filled with an ink substance or ink 40 having a high dielectric constant. The slotline waveguide of tag 30 effectively acts as an electrically shorted section of waveguide and will support a standing wave pattern. The resonant slotline waveguide of tag 10 in an alternative embodiment of the invention is a resonant structure used to replace the parallel LC circuits of the embodiment illustrated in FIG. 1. In order for a resonant condition to exist in the waveguide of tag 30, the waveguide must have an effective electrical length of one-half of the wavelength at the resonant frequency. The detection circuitry for RF EAS systems generally operates in the range of around 8 MHz. Utilizing a traditional microwave waveguide with an air dielectric, resonance would only be achievable at 8 MHz if the waveguide were approximately 18 m long. As may be appreciated, this is impractical for a small article surveillance tag.

In accordance with the principles of the present invention, resonance may be achieved in tag 30 with substantially lower resonant frequencies and with smaller tags. In accordance with the principles of the present invention, ink 40 having a high dielectric constant is deposited into gap 38 to fill the gap between the generally parallel sides 39a, 39b (see FIG. 4). The high dielectric characteristics of the ink substance reduces the wavelength and the effective resonant frequency at which resonance occurs in tag 30. Therefore, the invention yields resonance in the slotline microwave circuit of tag 30 having a size much smaller than conventionally would be achieved utilizing traditional waveguide techniques.

When the tags of the invention are in a resonance condition, it is desirable that they have a high Quality factor or Q-factor as mentioned above. Generally, the Q-factor is directly proportional to the ratio of the energy stored within the slotline waveguide of tag 30 and the energy loss per cycle in the slotline waveguide. More specifically, the Q-factor is defined by Equation 22.

$$Q = 2\pi(\text{energy store in cavity})/\text{energy loss per cycle}$$

During a resonance condition, the Q-factor determines the sharpness of the resonance. That is, the Q-factor determines the height to width ratio of the resonant voltage peak plotted as a function of frequency. Generally, it is preferable to have a very high yet narrow band width resonant peak which will be achieved by a circuit with a high Q-factor. Generally, a circuit which incurs high power loss will have a low Q-factor whereas a low loss circuit will have a high Q-factor. For a resonant circuit of the invention to resonate or ring sharply, an ink binder having a small imaginary dielectric constant is preferably utilized to make the ink 40 of the invention. The formulas for the specific inks used in the waveguide circuit tags of Table 2 are as follows.

Ink 4

The coating formulation was made by mixing 52.5 g of aluminum flake slurry (average flake particle size of 22 μm×11.3 μm), which was 10% solids in n-propyl acetate, with 20 drops of dispersant (Ken-React KR 38S from Kenrich Petrochemicals, Inc. of Bayonne, N.J.) and 40 g of n-propyl acetate. To this was added 9.75 g of Acryloid B-82 (an acrylic polymer from Rohm and Haas Co.) in 22.75 g of n-propyl acetate. This 12% solids formulation has a 35/65 aluminum flake to binder ratio.

Ink 5

The coating formulation was made by mixing 84 g of aluminum flake slurry (average flake particle size of 22 μm×11.3 μm), which was 10% solids in n-propyl acetate, with 32 drops of dispersant (Ken-React 38S from Kenrich Petrochemicals, Inc. of Bayonne, N.J.) and 61.2 g of n-propyl acetate. To this was added 4.8 g of a silicone resin solution (Dow Corning 1-2577 Conformal Coating, 75% solids in toluene). This 8% solids formulation has a 70/30 aluminum flake to binder ratio.

Ink 6

The coating formulation is the same as Ink 3.

Prototypes of the slotline waveguide embodiment of the invention were fabricated and tested with the resulting resonant frequencies and Q-factors listed in Table 2 below.

TABLE 2

| No | Tag Prototype | Ink Nos | Length and Width of Pattern (cm) | Resonant Frequency (MHZ) | Quality Factor |
|----|---------------|---------|----------------------------------|--------------------------|----------------|
| 1  | Semicircle board/foil | 4 | 20 × 0.3 | 31 | 9.0 |
| 2  | Semicircle board/foil | 4 | 18 × 0.16 | 39 | 7.1 |
| 3  | Semicircle board/foil | 4 | 18 × 0.08 | 39 | 6.9 |
| 4  | Semicircle 2 coats board/foil | 5 | 16.5 × 0.16 | 26 | 10.6 |
| 5  | Semicircle 1 coat board/foil | 5 | 18 × 0.16 | 22 | 10.3 |
| 6  | Semicircle 2 coats plastic/foil | 5 | 16 × 0.16 | 28 | 15.3 |
| 7  | Semicircle 1 coat plastic/foil | 5 | 16.5 × 0.16 | 25 | 13.0 |
| 8  | spiral board/foil | 5 | 48 × 0.16 | 7.8 | 6.0 |
| 9  | Semicircle board/No foil | 5 | 18 × 0.16 | 38 | 2.6 |
| 10 | Semicircle plastic/foil | 6 | 17.5 × 0.16 | 24 | 9.1 |
| 11 | Square spiral plastic/foil | 5 | 32 × 0.16 | 14.6 | 9.1 |
| 12 | Square spiral board/foil | 5 | 47 × 0.16 | 9.3 | 5.2 |
| 13 | Semicircle board/ evaporated metal | 5 | 19.5 × 0.16 | 25 | 2.0 |
| 14 | Semicircle board/ evaporated metal | 5 | 18 × 0.16 | 27 | 2.2 |

Prototypes 1-7 and 9-10 utilized a semi-circular shaped gap 38 similar to that illustrated in FIG. 2. For the tags, a variety of different ink substances were utilized and fabricated as noted in the Table 2. Column 3 of Table 2 lists the length of each gap and the effective width of the gap whereas Columns 4 and 5 list the resonant frequencies and Q-factors, respectively. The various prototypes were fabricated utilizing different substrates and different ground planes as well as different gap shapes and gap dimensions. The first five tags were fabricated on a paperboard substrate approximately 0.16 inches thick laminated to a ground plane of aluminum foil approximately 0.0006 inches thick. As may be appreciated, the ground plane might also be fabricated from a metal other than aluminum. The gap shape was semi-circular as illustrated in FIG. 2A and had various different dimensions. The tag no. 4 was fabricated with two coats of ink 40 applied into gap 38 to yield an effective thickness of approximately 0.003 inches whereas tag no. 5 utilized a single coat having a thickness of approximately 0.0015 inches.

Tag nos. 6 and 7 were semicircular in shape; however, a sheet of polyethylene having a thickness of approximately 0.010 inches was utilized as a substrate to which a ground plane of foil was laminated. The dielectric ink of tag no. 6 was applied in two coats and had a thickness of approximately 0.003 inches whereas one coat of ink having a thickness of 0.0015 inches was utilized with tag no. 7.

Tag no. 8 utilized a gap having a spiral shape similar to the that illustrated in FIG. 2B on a paper substrate approximately 0.016 inches thick.

Tag no. 9 utilized a substrate of paper approximately 0.016 inches thick and essentially no foil ground plane 36. The dielectric ink in a semicircular pattern was applied directly to the paper substrate rather than being positioned in a ground plane gap 38.

Tag no. 10 utilized a semi-circular pattern on a polyethylene substrate approximately 0.010 inches thick.

Tag nos. 11 was fabricated on a polyethylene substrate approximately 0.010 inches thick and utilized a square spiral gap pattern similar to that illustrated in FIG. 2A. Prototype 12 also utilized a similar square spiral pattern and the substrate was a paper substrate approximately 0.016 inches thick.

Tags 13 and 14 were fabricated with the paper substrate approximately 0.016 inches thick and laminated to a polyester film with approximately 500 angstroms of vacuum metallized or evaporated aluminum ground plane deposited thereon.

Figure 6:
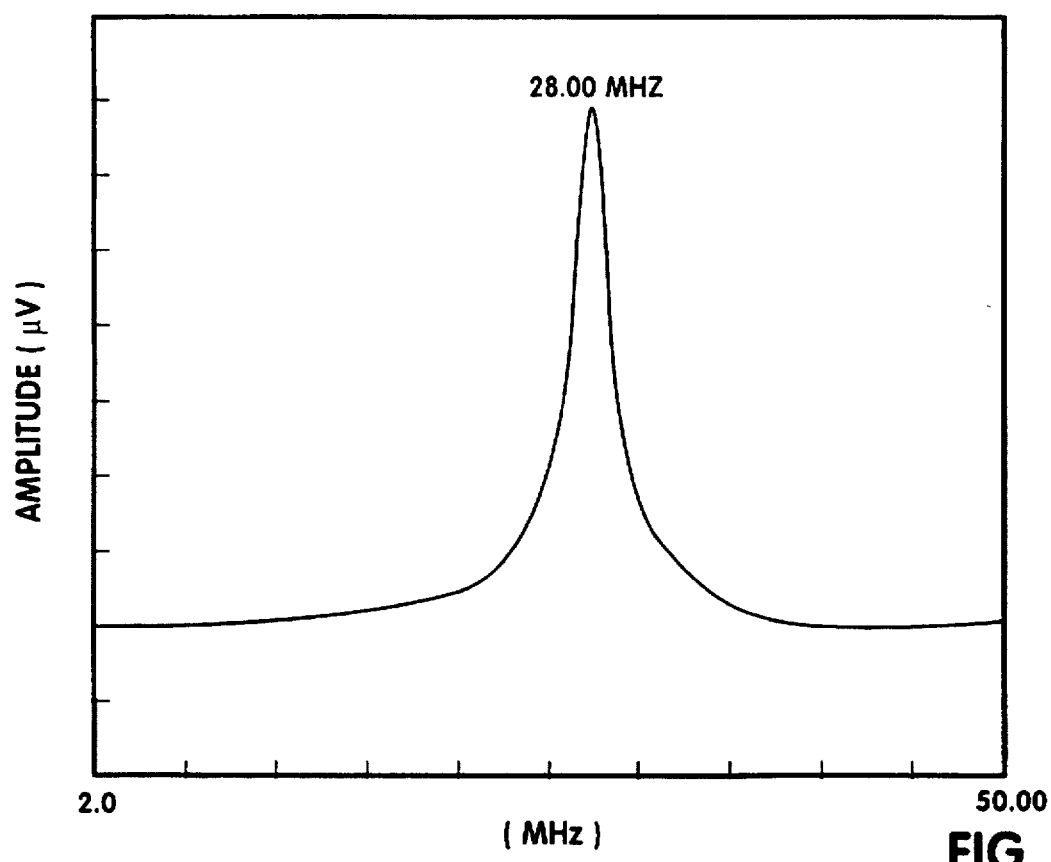
FIG. 6 is a voltage versus frequency plot for one embodiment of the present invention.
Figure 7:
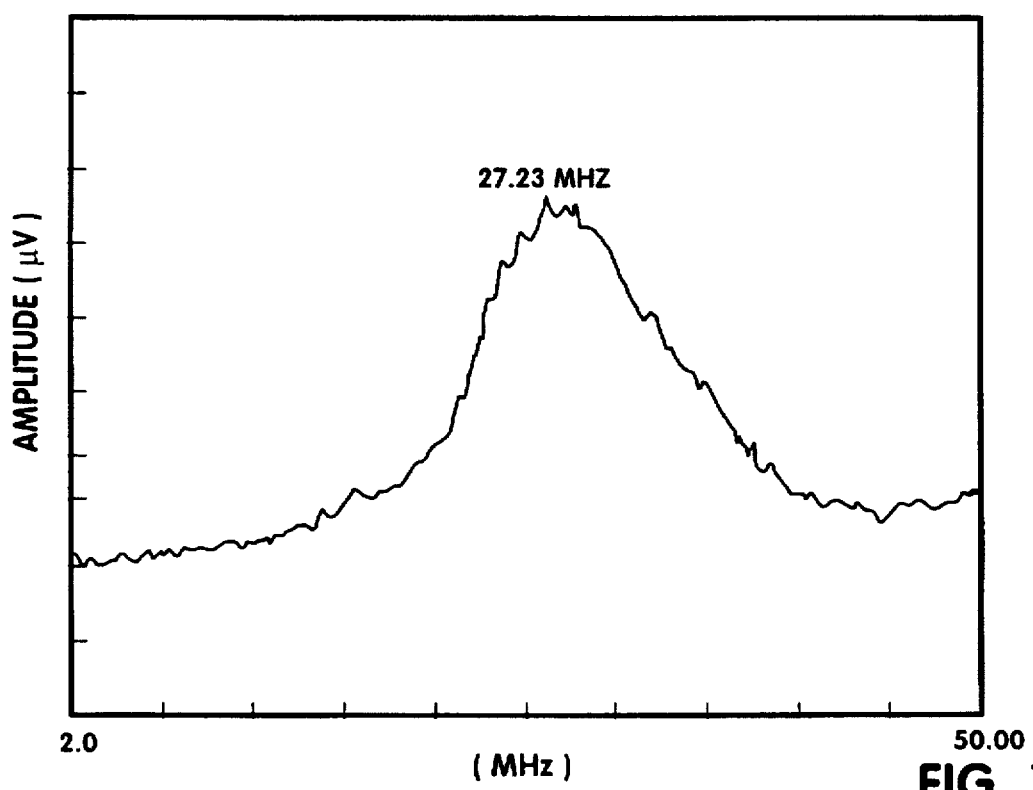
FIG. 7 is another voltage versus frequency plot for another embodiment of the present invention.

FIGS. 6 and 7 illustrate resonance curves achieved utilizing Tag nos. 6 and 14, respectively to illustrate the resonance achieved by some tags manufactured in accordance with the present invention .

To test the various tags, a short electric dipole antenna was coupled to the RF input terminal of the HP Spectrum Analyzer and was taped at a position approximate the end of the gap on the back face surface of the substrate, i.e., on the face surface that does not contain the slotline gap and the dielectric ink. Next, a short electrical dipole antenna was coupled to the RF output port of the Spectrum Analyzer to provide a test signal and was positioned near the center of the ink filled slotline gap and the network analyzer was scanned over the frequency range to achieve a resonance plot as illustrated in FIGS. 6 and 7 for tags 6 and 14, respectively. The Quality Factor was determined by dividing the resonance frequency by the band width, and the band width was determined by the distance between the two half-power frequencies of the plot. As illustrated in FIG. 6, the tag no. 6 had a Q-factor of approximately 15.3 yielding a relatively sharp peak and narrow band width. However, the tag no. 14 had a substantially lower Q-factor of 2.2 and thus yielded a peak that was not very sharp and further had a substantially broader band width.

It will be noticed that Q is better on an aluminum foil ground plane than on vacuum metallized aluminum ground planes. As determined by tag no. 9, resonance may be achieved in a dielectric waveguide with no ground plane, but 1 is poor. To get a good Q factor, a conductive ground plane is generally necessary.

In fabricating the slotline resonators of the tested tags, the gap or slot 38 was cut into the conductive ground plane film 36 and caulking compound was mounded around the parallel-sided gap 38. Next, the appropriate high dielectric ink was applied into the slot and was left to dry overnight. The tag was then subsequently placed at 60° C. in an oven for further curing of the ink.

Figure 3:
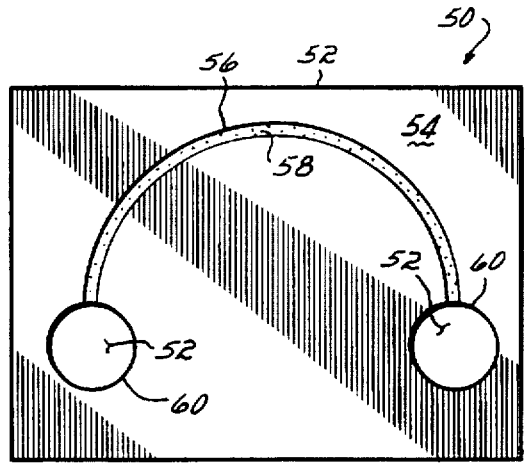
FIG. 3 is another embodiment of the tag structure in accordance with the principles of the present invention.

FIG. 3 illustrates another alternative embodiment of the invention in which the tag 50 includes a substrate 52 with a conductive layer or film on one face surface of the substrate to form a ground plane 54. A gap 56 is formed and filled with a high dielectric ink substance 58 in accordance with the principles of the present invention. However, FIG. 3 varies from the embodiment illustrated in FIG. 2 by utilizing two generally circular patterns 60 at the end of gap 58 which are formed by removing or etching away the ground plane layer 54. The patterns 60 are not filled with ink but are rather are left open to expose the substrate 52 below.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. An electronic article surveillance tag comprising:

a substrate having a face surface;

a first element positioned on the face surface and operable for having electrically inductive properties when an electrical signal is applied thereto, the first element having spaced portions;

a second element positioned on the face surface to contact said first element spaced portions and span therebetween, the contacting first element spaced portions and second element operable for having electrically capacitive properties when said electrical signal is applied thereto;

the first and second elements being operably coupled together to form a resonant circuit which resonates when an electrical signal of a predetermined resonant frequency is applied to the tag;

the second element comprising a dielectric ink substance on the substrate, the dielectric ink substance being characterized by a high dielectric constant for producing the desired resonant circuit on a single face surface of the substrate.

2. The electronic article surveillance tag of claim 1 further comprising a dielectric ink substance having a dielectric constant in the range of approximately 5,000 to 1,000,000.

3. The electronic article surveillance tag of claim 1 wherein the inductive and capacitive elements are operable for forming a resonant circuit that resonates at a predetermined resonant frequency in the range of approximately 7 to 10 MHz.

4. The electronic article surveillance tag of claim 1 wherein the substrate is one of plastic and paper.

5. The electronic article surveillance tag of claim 1 wherein said inductive element is generally planar, the inductive element being generally parallel to said substrate face surface.

6. The electronic article surveillance tag of claim 1 wherein the inductive element is spirally shaped and includes at least two adjacent intercoil turns, the dielectric ink substance of said capacitive element applied to the face surface between the adjacent intercoil turns for operably coupling the inductive and capacitive elements together.

7. The electronic article surveillance tag of claim 1 wherein the inductive element comprises a spiral conductor positioned on the face surface and having inductance properties.

8. The electronic article surveillance tag of claim 7 wherein the spiral conductor includes aluminum.

9. The electronic article surveillance tag of claim 7 wherein the spiral conductor has a circular shape.

10. The electronic article surveillance tag of claim 7 wherein the spiral conductor has a rectangular shape.

11. The electronic article surveillance tag of claim 1 wherein the dielectric ink substance includes flakes of a conductive material.

12. The electronic article surveillance tag of claim 11 wherein the conductive material is a metal.

13. The electronic article surveillance tag of claim 11 wherein the conductive material includes aluminum.

14. An electronic article surveillance tag comprising:

a substrate having a face surface;

a conductive layer positioned on the substrate face surface;

a gap formed in the conductive layer and exposing a portion of the substrate;

the gap and conductive layer operably forming a waveguide having an effective resonance condition such that the tag resonates when an electrical signal of a predetermined resonant frequency is applied thereto;

a dielectric ink substance positioned in at least a portion of the gap, the dielectric ink substance being characterized by a dielectric constant substantially higher than the dielectric constant of air for lowering the predetermined resonant frequency at which the tag resonates.

15. The electronic article surveillance tag of claim 14 wherein the gap comprises long, generally parallel conductive sides.

16. The electronic article surveillance tag of claim 14 wherein the gap is generally in the shape of a semi-circle.

17. The electronic article surveillance tag of claim 14 further comprising a non-conductive substrate area proximate at least one end of the gap.

18. The electronic article surveillance tag of claim 14 wherein the conductive layer is aluminum.

19. The electronic article surveillance tag of claim 14 wherein the substrate is one of plastic and paper.

20. The electronic article surveillance tag of claim 14 further comprising a dielectric ink substance having a dielectric constant in the range of approximately 5,000 to 1,000,000.

21. The electronic article surveillance tag of claim 14 wherein the dielectric ink substance produces resonance at a predetermined resonant frequency in the range of 7 to 10 MHz.

22. The electronic article surveillance tag of claim 14 wherein the dielectric ink substance includes flakes of a conductive material.

23. The electronic article surveillance tag of claim 22 wherein the conductive material is a metal.

24. The electronic article surveillance tag of claim 22 wherein the conductive material includes aluminum.

25. The electronic article surveillance tag of claim 14 wherein the gap has a generally spiral shape.

26. The electronic article surveillance tag of claim 25 wherein the spirally-shaped gap includes intercoil turns portions which are generally circular.

27. The electronic article surveillance tag of claim 26 wherein the spirally shaped gap includes intercoil turns portions which are generally rectangular.

28. An electronic article surveillance tag comprising:

a substrate having a face surface;

a dielectric pattern positioned on the substrate face surface;

the substrate and dielectric pattern operably forming a waveguide having an effective resonance condition such that the tag resonates when an electrical signal of a predetermined resonant frequency is applied thereto;

the dielectric pattern including a dielectric ink substance positioned on the substrate, the dielectric ink substance being characterized by a dielectric constant substantially higher than the dielectric constant of air for lowering the predetermined resonant frequency at which the tag resonates.

29. The electronic article surveillance tag of claim 28 wherein the dielectric pattern is generally in the shape of a semi-circle.

30. The electronic article surveillance tag of claim 28 wherein the substrate is one of plastic and paper.

31. The electronic article surveillance tag of claim 28 further comprising a dielectric ink substance having a dielectric constant in the range of approximately 5,000 to 1,000,000.

32. The electronic article surveillance tag of claim 28 wherein the dielectric ink substance includes flakes of a conductive material.

33. The electronic article surveillance tag of claim 32 wherein the conductive material is a metal.

34. The electronic article surveillance tag of claim 32 wherein the conductive material includes aluminum.

35. The electronic article surveillance tag of claim 28 wherein the dielectric pattern has a generally spiral shape.

36. The electronic article surveillance tag of claim 35 wherein spirally-shaped dielectric pattern includes intercoil turns portions which are generally circular.

37. The electronic article surveillance tag of claim 36 wherein the spirally-shaped dielectric pattern includes intercoil turns portions which are generally rectangular.

38. A method of manufacturing an article surveillance tag comprising:

providing a substrate having a face surface;

positioning an element having electrically inductive properties on the face surface, the element having spaced portions;

applying a dielectric ink substance, characterized by a high dielectric constant, onto the substrate to contact said element spaced portions and span therebetween and to form a capacitive element;

operably coupling the inductive and capacitive elements together for forming a resonant circuit which resonates when an electrical signal of a predetermined resonant frequency is applied to the tag.

39. The method of claim 38 further comprising forming the inductive element in the shape of a spiral conductor.

40. The method of claim 38 further comprising applying a dielectric ink substance having a dielectric constant in the range of approximately 5,000 to 1,000,000.

41. The method of claim 38 further comprising applying the dielectric ink substance to the face surface to contact a portion of the inductive element for coupling the elements together to form a resonant circuit.

42. The method of claim 38 further comprising forming the inductive element in the shape of a spiral conductor and applying the dielectric ink substance to the face surface between the adjacent intercoil turns for operably coupling the inductive and capacitive elements together.

43. A method of manufacturing an article surveillance tag comprising:

providing a substrate having a face surface;

positioning a conductive layer on the substrate face surface;

forming a gap in the conductive layer and exposing a portion of the substrate;

depositing a dielectric ink substance, characterized by a high dielectric constant, in a portion of the gap and forming a waveguide having an effective resonance condition such that the tag resonates when an electrical signal of a predetermined resonant frequency is applied thereto.

44. The method of claim 43 comprising forming the gap generally in the shape of a semi-circle.

45. The method of claim 43 further comprising applying a dielectric ink substance having a dielectric constant in the range of approximately 5,000 to 1,000,000.

* * * * *

UNITED STATES PATENT AND TRADEMARK OFFICE
CERTIFICATE OF CORRECTION

PATENT NO. : 5,781,110
DATED : 07/14/98
INVENTOR(S) : Charles C. Habeger, Jr. and Kenneth A. Pollart It is certified that error appears in the above-identified patent and that said Letters Patent is hereby corrected as shown below:

Column 7, line 10, the equation should read -- $X_t = [1 \pm (1-4\alpha)^{1/2}]/2\alpha$ --

Column 8, line 15, "$\sum$" should read -- "$\epsilon$". --

Column 11, line 11, "(MHZ)" should read --(MHz)--.

Column 12, lien 52, "1 is poor" should read -- Q is poor--.

Signed and Sealed this

Twenty-seventh Day of April, 1999

Attest:

Q. TODD DICKINSON

*Attesting Officer*    *Acting Commissioner of Patents and Trademarks*